(12) United States Patent
Myeong et al.

(10) Patent No.: US 9,826,626 B2
(45) Date of Patent: Nov. 21, 2017

(54) DISPLAY DEVICE

(71) Applicant: SAMSUNG DISPLAY CO., LTD., Yongin, Gyeonggi-Do (KR)

(72) Inventors: Mansik Myeong, Seoul (KR); Seong Sik Ahn, Seoul (KR); Sungsik Yun, Suwon-si (KR); Sung Chul Choi, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 99 days.

(21) Appl. No.: 14/697,739

(22) Filed: Apr. 28, 2015

(65) Prior Publication Data

US 2016/0150657 A1     May 26, 2016

(30) Foreign Application Priority Data

Nov. 25, 2014    (KR) ........................ 10-2014-0165360

(51) Int. Cl.
*H05K 5/00*        (2006.01)
*H05K 1/02*        (2006.01)
(Continued)

(52) U.S. Cl.
CPC ............... *H05K 1/028* (2013.01); *G06F 1/16* (2013.01); *G06F 1/1652* (2013.01); *G09F 9/301* (2013.01);
(Continued)

(58) Field of Classification Search
CPC .... G06F 1/1652; G06F 1/1641; G06F 1/1601; G06F 1/1616; G06F 1/1647;
(Continued)

(56) References Cited

U.S. PATENT DOCUMENTS

| 6,577,496 | B1* | 6/2003 | Gioscia | ................. | G06F 1/1616 |
| | | | | | 345/156 |
| 8,183,459 | B2* | 5/2012 | Wei | ....................... | G06F 1/1624 |
| | | | | | 174/50 |

(Continued)

FOREIGN PATENT DOCUMENTS

| JP | 2006/072115 A | 3/2006 |
| JP | 2013/050547 A | 3/2013 |
| KR | 10-2011-0100936 A | 9/2011 |

*Primary Examiner* — James Wu
*Assistant Examiner* — Michael Matey
(74) *Attorney, Agent, or Firm* — Lee & Morse, P.C.

(57) ABSTRACT

A display device includes a first support frame including a first slant surface having a slant angle, a second support frame including a second slant surface symmetrical with and having a same structure as the first slant surface, a display panel on the first and second support frames, and a connection member connecting the first and second support frames to be rotatable around a rotational axis defined by the connection member, wherein the first and second slant surfaces are in areas of upper surfaces of the first and second support frames, respectively, and wherein first areas of the first and second support frames have a larger thickness than second areas of the first and second support frames, respectively, the first areas being adjacent to first sides of the first and second slant surfaces, and the second areas being adjacent to second sides of the first and second slant surfaces.

19 Claims, 9 Drawing Sheets

(51) Int. Cl.
   *H05K 5/02* (2006.01)
   *G06F 1/16* (2006.01)
   *H04M 1/02* (2006.01)
   *G09F 9/30* (2006.01)

(52) U.S. Cl.
   CPC ......... *H04M 1/0202* (2013.01); *H04M 1/022* (2013.01); *H04M 1/0268* (2013.01)

(58) Field of Classification Search
   CPC .... G06F 1/1681; G06F 3/0412; G06F 1/1615; G06F 1/1626; G06F 3/04886; G06F 1/16; G06F 1/1684; G06F 1/1637; G06F 1/1618; G06F 3/147; G06F 1/1649; G06F 1/1633; G06F 1/1675; G06F 1/181; H04M 1/0268; H04M 1/022; H04M 1/0247; H04M 1/0266; H04M 2250/16; H04M 1/0214; G09G 2300/023; G09G 3/2092; H05K 5/0017; H05K 5/0226; H05K 13/00; H05K 13/046; H05K 1/028; H05K 7/16; H05K 5/0217; H05K 2201/055; H05K 2201/10128; H05K 2201/2027; E05D 7/00; G02F 1/133308; G02F 2001/133322; Y10T 16/547; H01L 51/0097; Y10S 345/903
   See application file for complete search history.

(56) References Cited

U.S. PATENT DOCUMENTS

| | | | |
|---|---|---|---|
| 9,301,389 B2* | 3/2016 | Yeo | H05K 1/0281 |
| 9,348,450 B1* | 5/2016 | Kim | G06F 3/0412 |
| 2012/0243207 A1* | 9/2012 | Wang | G09F 9/301 |
| | | | 362/97.1 |
| 2013/0010405 A1 | 1/2013 | Rothkopf et al. | |
| 2013/0037228 A1 | 2/2013 | Verschoor et al. | |
| 2014/0029171 A1* | 1/2014 | Lee | H05K 7/16 |
| | | | 361/679.01 |
| 2014/0042293 A1* | 2/2014 | Mok | G06F 1/1652 |
| | | | 248/682 |
| 2014/0111954 A1* | 4/2014 | Lee | G06F 1/1641 |
| | | | 361/749 |
| 2015/0233162 A1* | 8/2015 | Lee | H04M 1/02 |
| | | | 16/223 |
| 2016/0085265 A1* | 3/2016 | Park | G06F 1/1652 |
| | | | 361/807 |

\* cited by examiner

AL  DA  NDA  DP

DISPLAY DEVICE

CROSS-REFERENCE TO RELATED APPLICATION

Korean Patent Application No. 10-2014-0165360, filed on Nov. 25, 2014, in the Korean Intellectual Property Office, and entitled: "Display Device," is incorporated by reference herein in its entirety.

BACKGROUND

1. Field

The present disclosure relates to a display device. More particularly, the present disclosure relates to a display device capable of preventing a display panel from being damaged when the display panel is folded.

2. Description of the Related Art

In recent years, technology for a display device has been developed. For example, various display devices, e.g., a display device having a flexible display panel that is bent or rolled, a display device having a stretchable display panel having elasticity in at least one direction, etc., have been developed. Such display devices may be deformed into a predetermined shape or into various shapes according to a user's demand.

Among the display devices, the flexible display device may include a flexible display with a plastic substrate having flexibility and electrical elements disposed on the plastic substrate. The display device may further include a support frame formed to be bent, so the flexible display panel is disposed on the support frame. As such, the flexible display panel is folded by the support frame.

SUMMARY

Embodiments provide a display device including a first support frame including a first slant surface having a predetermined slant angle, a second support frame including a second slant surface having a same structure as the first slant surface and being disposed symmetrically with respect to the first slant surface, a display panel disposed on the first and second support frames, and a connection member connecting the first and second support frames, the first and second support frames being rotatable around a rotational axis defined by the connection member, wherein the first and second slant surfaces are disposed in predetermined areas of upper surfaces of the first and second support frames, respectively, and wherein first areas of the first and second support frames have a larger thickness than second areas of the first and second support frames, respectively, the first areas being adjacent to respective first sides of the first and second slant surfaces, and the second areas being adjacent to respective second sides of the first and second slant surfaces and being connected to the connection member.

The display device further includes a first moving bar disposed under the display panel and on the first slant surface and rotated with respect to the rotational axis adjacent to the one side of the first slant surface and a second moving bar having a same structure as the first moving bar, disposed under the display panel and on the second slant surface, and rotated with respect to the rotational axis adjacent to the one side of the second slant surface.

The first and second support frames include a long side in a first direction and a short side in a second direction crossing the first direction and the first and second moving bars include a short side in the first direction and a long side in the second direction.

The first support frame further includes a first extension part having a first thickness, a second extension part having the first slant surface, a third extension part having a second thickness smaller than the first thickness, and two first protrusions protruded from a side surface of the first extension part adjacent to the second extension part, disposed adjacent to an upper surface of the first extension part in a third direction crossing the first and second directions, and respectively disposed at both sides of the first extension part in the second direction. Lower surfaces of the first, second, and third extension parts are disposed to be substantially parallel to each other, one side of the second extension part in the first direction is connected to the first extension part, the other side of the second extension part is connected to one side of the third extension part, the other side of the third extension part is connected to the connection member, and the first slant surface corresponds to an upper surface of the second extension part bent downward toward the third extension part at a predetermined angle with respect to the first direction.

One side of the first slant surface in the first direction is connected to a lower portion of the side surface of the first extension part between the first protrusions and the other side of the first slant surface in the first direction is connected to a boundary of an upper surface of the third extension part adjacent to the second extension part.

The second support frame further includes fourth, fifth, and sixth extension parts and second protrusions respectively having the same structure as the first, second, and third extension parts and the first protrusions and disposed to be symmetrical with the first, second, and third extension parts and the first protrusions. The fifth extension part includes the second slant surface, one side of the fifth extension part in the first direction is connected to the fourth extension part, the other side of the fifth extension part in the first direction is connected to one side of the sixth extension part, and the other side of the sixth extension part is connected to the connection member.

Each of the first protrusions includes a first hole formed through a corresponding first protrusion of the first protrusions along the second direction.

The first moving bar includes two second grooves disposed adjacent to one side of the first moving bar in the first direction and recessed from both side surfaces of the second moving bar in the second direction to a center portion of the first moving bar and a second hole formed through the first moving bar between the second grooves along the second direction. The first moving bar between the second grooves is disposed between the first protrusions, and the first holes are disposed to overlap with the second hole.

The display device further includes a first pin unit having a cylindrical shape elongated in the second direction, and the first pin unit is inserted into the first holes and the second hole.

The display device further includes a second pin unit having a same structure as the first pin unit. Each of the second protrusions includes a third hole having a same structure as the first hole and disposed to be symmetrical with the first hole, the second moving bar includes fourth grooves and a fourth hole, which respectively have a same structure as the second grooves and the second hole and are disposed symmetrical with the second grooves and the second hole. The second moving bar between the fourth grooves is disposed between the second protrusions, the third holes are disposed to overlap with the fourth hole, and the second pin unit is inserted into the third holes and the fourth hole.

The first moving bar is rotated with respect to the first pin unit and the second moving bar is rotated with respect to the second pin unit.

The connection member includes a first connection member and a second connection member, which are respectively disposed adjacent to the other sides of the third and sixth extension parts in the first direction and respectively connected to both side surfaces of each of the third and sixth extension parts in the second direction.

The first connection member includes first and second hinge units extending in and arranged in the third direction, a first connection unit connecting one side of the first hinge unit to one side of the second hinge unit, which face each other in the third direction, and third pin units extending in the second direction to connect the one side of the first hinge unit and the one side of the second hinge unit to both sides of the first connection unit, respectively. The second connection member includes third and fourth hinge units, a second connection unit, and fourth pin units, which have the same structures as the first and second hinge units, the first connection unit, and the third pin units and are disposed to be symmetrical with the first and second hinge units, the first connection unit, and the third pin units. The other sides of the first and third hinge units in the third direction are respectively connected to the other side of the third extension part in the first direction and the both side surfaces of the third extension part in the second direction, and the other sides of the second and fourth hinge units in the third direction are respectively connected to the other side of the sixth extension part in the first direction and the both side surfaces of the sixth extension part in the second direction.

Each of the first and third hinge units is rotated with respect to a corresponding pin unit of the third and fourth pin units and each of the second and fourth hinge units is rotated with respect to a corresponding pin unit of the third and fourth pin units.

The display device further includes a plurality of first elastic members having a predetermined elastic force and a plurality of second elastic members having a same structure as the first elastic members and being disposed to be symmetrical with the first elastic members. The second extension part further includes a plurality of first grooves arranged in the second direction and recessed downward from the upper surface of the second extension part. The fifth extension part further includes a plurality of third grooves having a same structure as the first grooves and being disposed to be symmetrical with the first grooves, each of the first elastic members is disposed in a corresponding first groove of the first grooves, each of the second elastic members is disposed in a corresponding third groove of the third grooves, and a length in the third direction of the first and second elastic members is longer than a depth of the first and second grooves.

The display panel has a restoring force greater than an elastic force of the first and second elastic members, the first and second moving bars move to make contact with the first and second slant surfaces by the restoring force of the display panel when the display panel is folded, the first and second moving bars move upwardly by the first and second elastic members when the display panel is unfolded, a length in the third direction of the first and second elastic members is set to allow the first and second moving bars to move to a height substantially parallel to the upper surface of the first and fourth extension parts.

When the display panel is folded, a curvature of a first curvature portion defined by a predetermined area of a center portion of the display panel disposed between the third and sixth extension parts is greater than a curvature of a second curvature portion defined by a predetermined area of the display panel, which corresponds to each of a predetermined area of the second extension part adjacent to a boundary between the first and second extension parts and a predetermined area of the fifth extension part adjacent to a boundary between the fourth and fifth extension parts.

A slant angle of each of the first and second slant surfaces is set to allow the curvature of the first curvature portion to be greater than the curvature of the second curvature portion.

The display device further includes a plurality of dummy layers disposed on or under the second curvature portion and having flexibility, and the dummy layers are disposed in a non-display area neighboring a display area of the display panel.

The display device further includes a plurality of dummy layers disposed under the second curvature portion and a non-display area neighboring a display area of the display panel. Each of the dummy layers includes a plurality of layer units arranged in the first direction and being a rigid type, a side surface of each of the layer units has a trapezoid shape when viewed in the second direction, a lower edge of the layer units is longer than an upper edge of the layer units, and left and right edges of each of the layer units has a same slant angle.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
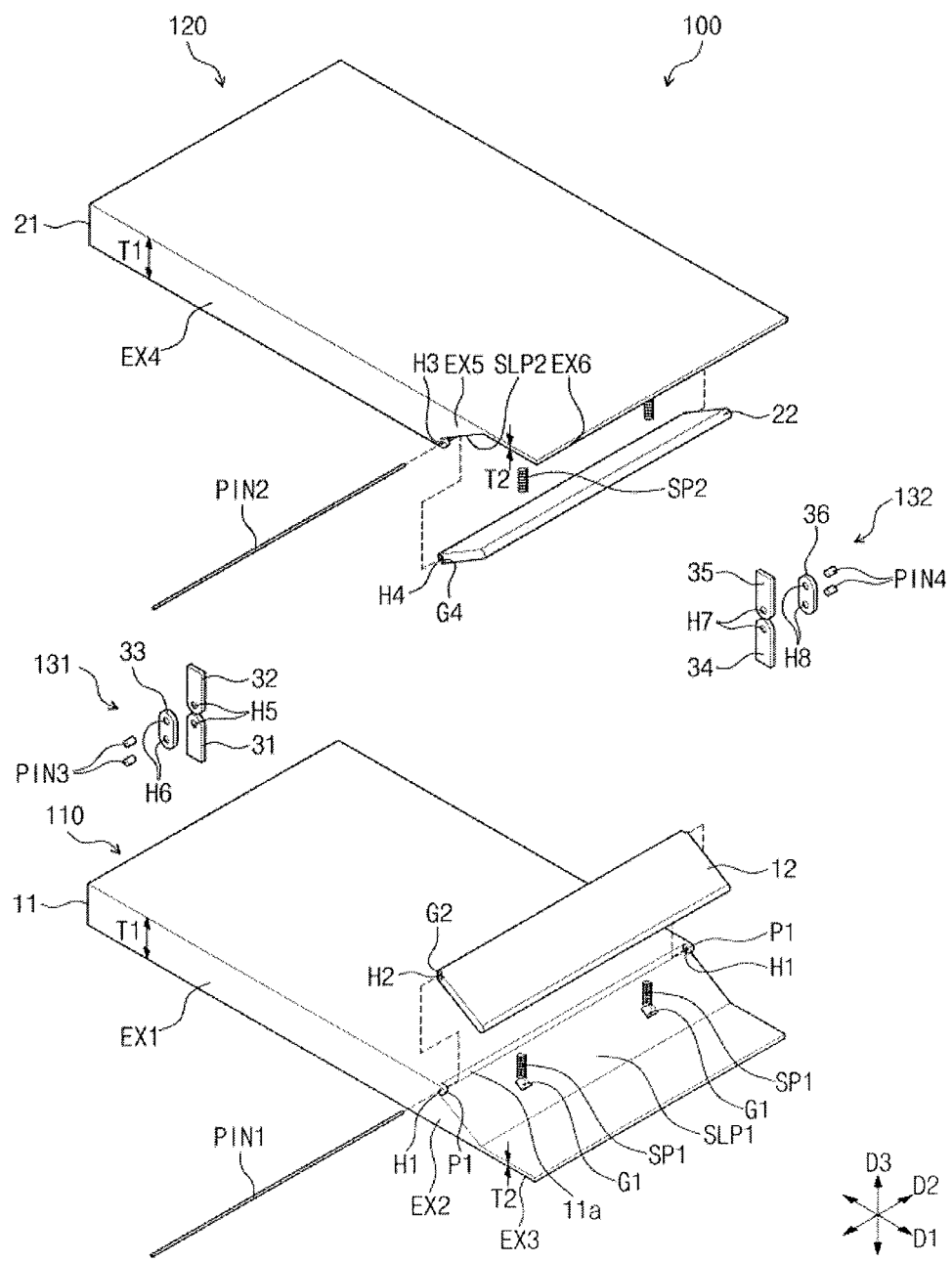
FIG. 1 illustrates an exploded perspective view of a folding device applied to a display device according to a first exemplary embodiment of the present disclosure.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Similar terminology, e.g., "connected to" or "coupled to," is interpreted in a same manner. Like reference numerals refer to like elements throughout.

As used herein, the term "and/or" includes any and all combinations of one or more of the associated listed items. It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

FIG. 1 illustrates an exploded perspective view of a folding device applied to a display device 100 according to a first exemplary embodiment of the present disclosure.

Referring to FIG. 1, a folding device of the display device 100 may include a first housing 110, a second housing 120, and connection members 131 and 132.

Each of the first and second housings 110 and 120 has long sides in a first direction D1 and short sides in a second direction D2. The first and second housings 110 and 120 have the same configurations and are disposed to face each other in a third direction D3 substantially perpendicular to the first and second directions D1 and D2.

The connection members 131 and 132 are connected to a first side portion of the first housing 110 and to a first side portion of the second housing 120 in the first direction D1 to provide a rotational axis to the first side portions of the first and second housings 110 and 120. Accordingly, the first and second housings 110 and 120 are rotated along the rotational axis by external force, and thus the first and second housings 110 and 120 are folded to face each other (FIG. 2) or unfolded. The configurations of the folding device will be described in detail later.

The first housing 110 includes a first support frame 11, a first moving bar 12, a plurality of first elastic members SP1, and a first pin unit PIN1. The first support frame 11 has a long side in the first direction D1 and a short side in the second direction D2.

The first support frame 11 includes a flat portion and a first slant surface SLP1 with a predetermined slant angle extending from the flat portion. In detail, a first area of the first support frame 11, i.e., an area disposed adjacent to a first side of the first slant surface SLP1 in the first direction D1, has a first thickness T1. A second area of the first support frame 11, i.e., an area disposed adjacent to a second side of the first slant surface SLP1 and connected to the connection members 131 and 132, has a second thickness T2 smaller than the first thickness T1. For example, as illustrated in FIG. 1, the first slant surface SLP1 is connected between the first and second areas of the first support frame 11.

In detail, the first support frame 11 includes a first extension part EX1, a second extension part EX2, a third extension part EX3, and two first protrusions P1. The first, second, and third extension parts EX1, EX2, and EX3 are arranged in the first direction D1. The second extension part EX2 includes the first slant surface SLP1, so a first side of the second extension part EX2 is connected to the first extension part EX1, which includes the first area of the support frame 11, in the first direction D1, and a second side of the second extension part EX2 is connected to the third extension part EX3, which includes the second area of the support frame 11, in the first direction D1. Further, a first side of the third extension part EX3 is connected to the second side of the second extension part EX2 in the first direction D1, and a second side of the third extension part EX3 is connected to the connection members 131 and 132 in the first direction D1.

The first, second, and third extension parts EX1, EX2, and EX3 are disposed to have their lower surfaces substantially parallel, e.g., and level, with each other, while the first slant surface SLP1 connects upper surfaces of the first and third extension parts EX1 and EX3. The first extension part EX1 has the first thickness T1 in the third direction D3. The third extension part EX3 has the second thickness T2 smaller than the first thickness T1 in the third direction D3.

The first protrusions P1 protrude from a side surface 11a of the first extension part EX1 toward the second extension part EX2, and are disposed adjacent to the second extension part EX2. In detail, the first protrusions P1 protrude to the right (in view of FIG. 1) in the first direction D1. In addition, the first protrusions P1 are adjacent to an upper surface of the first extension part EX1 in the third direction D3, and are disposed at both sides of the first extension part EX1 in the second direction D2. Each of the first protrusions P1 is provided with a first hole H1 formed therethrough in the second direction D2.

The side surface 11a of the first extension part EX1, which is adjacent to the second extension part EX2 in the first direction D1 and disposed between the first protrusions P1, has a concave arc shape. In detail, the side surface 11a of the first extension part EX1 between the first protrusions P1 is recessed to be concaved to the left (in view of FIG. 1) in the first direction D1.

The second extension part EX2 has a thickness smaller than the first thickness T1 in the third direction D3, and is equal to or greater than the second thickness T2 of the third extension part EX3. In detail, the second extension part EX2 extends from a bottom of the side surface 11a of the first extension part EX1, e.g., so a maximal thickness of the second extension EX2 in the third direction D3 is smaller than the first thickness T1 of the first extension part EX1. Further, the second extension part EX2 extends from the bottom of the side surface 11a to a top of the third extension part EX3 at a predetermined slant angle, so the thickness of the second extension part EX2 in the third direction D3 decreases as a distance from the second side of the second extension part EX2 decreases. An upper surface of the second extension part EX2 is downwardly bent toward the third extension part EX3 with respect to the first direction D1 to form the first slant surface SLP1.

The first side in the first direction D1 of the first slant surface SLP1 is connected to a lower portion of the side surface 11a of the first extension part EX1 between the first protrusions P1, and the second side in the first direction D1 of the first slant surface SLP1 is connected to a boundary of the upper surface of the third extension part EX3, which is adjacent to the second extension part EX2. The first slant surface SLP1, i.e., an upper surface of the second extension part EX2, is recessed downwardly and includes a plurality of first grooves G1 corresponding to the first elastic members SP1.

For example, the first grooves G1 may be disposed at a center portion of the second extension part EX2 in the first direction D1, and may be arranged at predetermined intervals in the second direction D2. Each of the first elastic members SP1 has a predetermined elasticity, and is disposed in a corresponding first groove G1. A length in the third direction D3 of the first elastic members SP1, i.e., in a non-compressed state, is longer than a depth of the first grooves G1, i.e., so the non-compressed first elastic members SP1 extend above the first grooves G1. As an example, FIG. 1 illustrates two first grooves G1 and two first elastic members SP1, but the number of each of the first grooves G1 and the first elastic members SP1 is not be limited to two.

The first moving bar 12 is disposed on the first slant surface SLP1, and is rotated with respect to the rotational axis adjacent to the first side of the first slant surface SLP1 in the first direction D1. In detail, the first moving bar 12 has a short side in the first direction D1 and a long side in the second direction D2. Both side surfaces in the first direction D1 of the first moving bar 12 may have a convex arc shape.

The first moving bar 12 includes two second grooves G2 and a second hole H2. The second grooves G2 are disposed adjacent to a first side of the first moving bar 12 in the first direction D1, and are recessed from both side surfaces of the first moving bar 12 toward a center of the first moving bar 12 in the second direction D2. The second hole H2 is formed through the first moving bar 12 between the second grooves G2 along the second direction D2.

The first moving bar 12 is disposed on the second extension part EX2. A portion of the first moving bar 12 between the second grooves G2 is disposed between the first protrusions P1 of the first extension part EX1, and each of the two first protrusions P1 is inserted into a corresponding second groove G2 in the first moving bar 12. In this case, the first hole H1 of each of the first protrusions P1 is disposed to overlap with the second hole H2 of the first moving bar 12.

Figure 2:
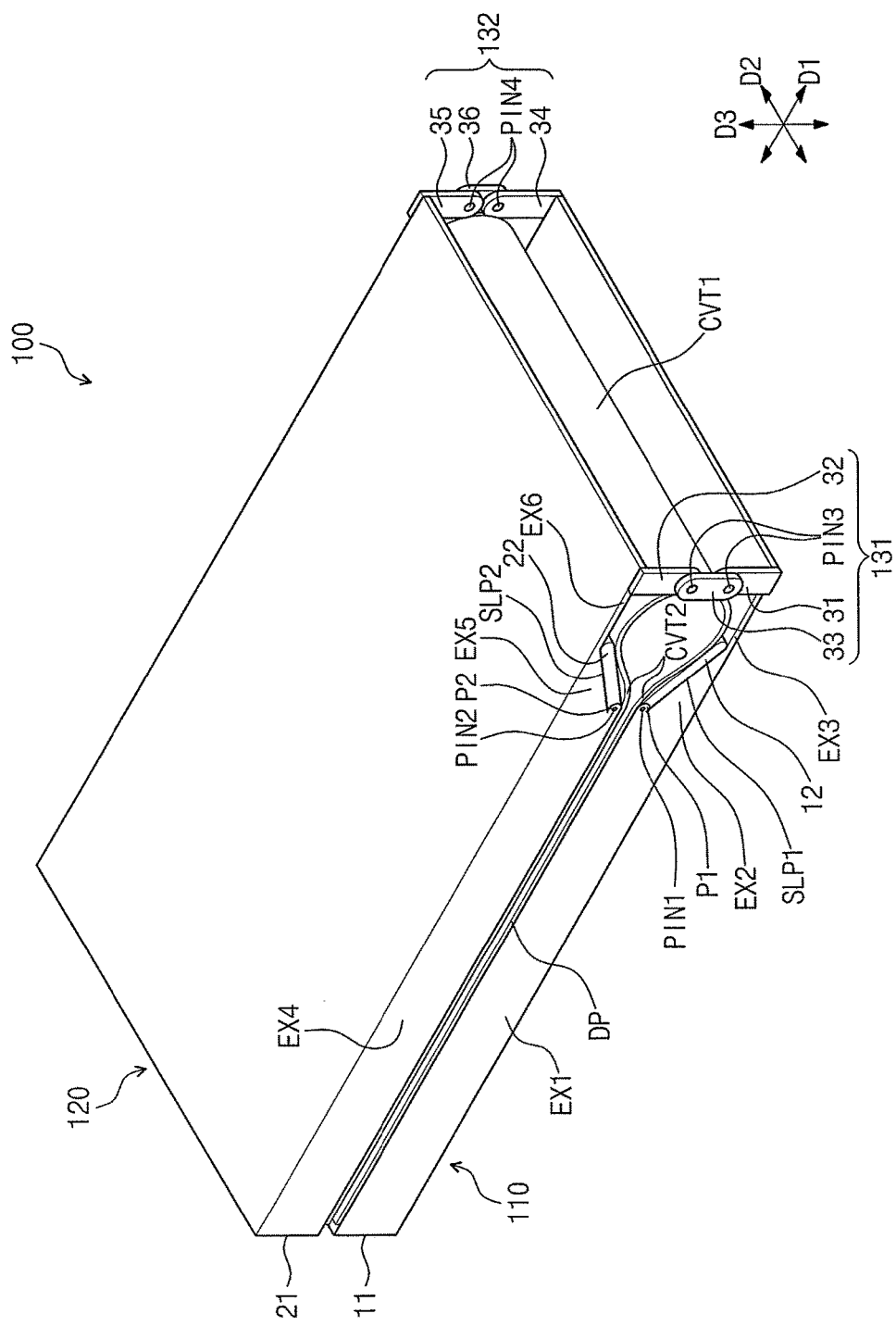
FIG. 2 illustrates a perspective view of a folding state of the display device according to the first exemplary embodiment of the present disclosure.

As described above, the side surface 11a of the first extension part EX1, which is adjacent to the second extension part EX2 in the first direction D1 and disposed between the first protrusions P1, has a concave arc shape, and one side surface of the first moving bar 12 in the first direction D1 has a convex arc shape (FIG. 2). Therefore, the convex side surface of the first moving bar 12 is disposed between the first protrusions P1 and to match with the concave side surface 11a of the first extension part EX1.

The first pin unit PIN1 has a substantially cylindrical shape elongated in the second direction D2. The first pin unit PIN1 is inserted into the first holes H1 and the second hole H2 to connect the first moving bar 12 to the first support frame 11. The first moving bar 12 is rotated with respect to the first pin unit PIN1. That is, the first pin unit PIN1 may be a rotational axis adjacent to the first side of the first slant surface SLP1 in the first direction D1, so the moving bar 12 may be rotated around the first pin unit PIN1. In addition, the first moving bar 12 moves to be spaced apart from the first slant surface SLP1 of the second extension part EX2 by the elastic force of the first elastic members SP1.

The second housing 120 includes a second support frame 21, a second moving bar 22, a plurality of second elastic members SP2, and a second pin unit PIN2, which have the same configurations as those of the first support frame 11, the first moving bar 12, the first elastic members SP1, and the first pin unit PIN1, respectively, and are disposed to be symmetrical with respect to the first support frame 11, the first moving bar 12, the first elastic members SP1, and the first pin unit PIN1. In other words, the first and second housings 110 and 120 may be structured and arranged as mirror images of each other.

In detail, the second support frame 21 includes a fourth extension part EX4, a fifth extension part EX5, a sixth extension part EX6, and two second protrusions P2, which have the same configurations as those of the first extension part EX1, the second extension part EX2, the third extension part EX3, and two first protrusions P1, respectively, and are disposed to be symmetrical with respect to the first extension part EX1, the second extension part EX2, the third extension part EX3, and the two first protrusions P1. Accordingly, a first side in the first direction D1 of the fifth extension part EX5 is connected to the fourth extension part EX4 and the second side in the first direction D1 of the fifth extension part EX5 is connected to a first side of the sixth extension part EX6, while a second side of the sixth extension part EX6 is connected to the connection members 131 and 132.

The fifth extension part EX5 includes a second slant surface SLP2 and a plurality of third grooves G3 (refer to FIG. 4), which have the same configurations as those of the first slant surface SLP1 and the first grooves, G1 and are disposed to be symmetrical with respect to first slant surface SLP1 and the first grooves G1. Each of the second protrusions P2 includes a third hole H3, which has the same configuration as that of the first hole H1 and is disposed to be symmetrical with respect to the first hole H1.

The second moving bar 22 includes fourth grooves G4 and a fourth hole H4, which have the same configurations as those of the second grooves G2 and the second hole H2 and are disposed to be symmetrical with respect to the second grooves G2 and the second hole H2.

Each of the second elastic members SP2 is disposed in a corresponding groove G3 of the third grooves G3. The second moving bar 22 is disposed on the second slant surface SLP2 of the fifth extension part EX5. The second moving bar 22 between the fourth grooves G4 is disposed between the second protrusions P2. Each of the two protrusions P2 is inserted into a corresponding fourth groove G4 of the fourth grooves G4.

The third hole H3 of each of the second protrusions P2 is disposed to overlap with the fourth hole H4 of the second moving bar 22. The second pin unit PIN2 is inserted into the third holes H3 and the fourth hole H4 to connect the second moving bar 22 to the second support frame 21.

The second moving bar 22 moves to rotate with respect to the second pin unit PIN2. That is, the second pin unit PIN2 may be the rotation axis disposed adjacent to one side of the second slant surface SLP2 in the first direction D1. In addition, the second moving bar 22 moves to be spaced apart from the second slant surface SLP2 of the fifth extension part EX5 by the elastic force of the second elastic members SP2.

The connection members 131 and 132 include a first connection member 131 and a second connection member 132. The first connection member 131 is disposed adjacent to first edges of the third and sixth extension parts EX3 and EX6 in the first direction D1, and is connected to side surfaces of the first edges of the third and sixth extension parts EX3 and EX6 in the second direction D2. The second connection member 132 is disposed adjacent to second edges of the third and sixth extension parts EX3 and EX6 in the first direction D1, and are connected to side surfaces of the second edges of the third and sixth extension parts EX3 and EX6 in the second direction D2. In other words, as illustrated in FIG. 2, the first and second connection members 132 may be on opposite sides of the display device 100 along the second direction D2, and each of the first and second connection members may extend vertically along the third direction to contact and connect to each other the first and second housings 110 and 120.

The first connection member 131 includes a first hinge unit 31, a second hinge unit 32, a first connection unit 33, and two third pin units PIN3. The first and second hinge units 31 and 32 extend in and are arranged in the third direction D3. Side surfaces, which face each other, of the first and second hinge units 31 and 32 have a convex arc shape. Each of the first and second hinge units 31 and 32 includes a fifth hole H5 disposed at one side of each of the first and second hinge units 31 and 32 in the third direction D3. The fifth hole H5 is formed through the one side of each of the first and second hinge units 31 and 32 along the second direction D2.

The other side of the first hinge unit 31 in the third direction D3 is connected to the other side of the third extension part EX3 in the first direction D1 and the one side of the third extension part EX3 in the second direction D2. The other side in the third direction D3 of the second hinge unit 32 is connected to the other side of the sixth extension part EX6 in the first direction D1 and the one side of the sixth extension part EX6 in the second direction D2.

The first connection unit 33 includes two sixth holes H6 disposed at both sides of the first connection unit 33 in the third direction D3. The sixth holes H6 are formed through the both sides of the first connection unit 33 in the third direction D3. Each of the sixth holes H6 of the first connection unit 33 is disposed to overlap with a corresponding fifth hole H5 of the fifth holes H5 of the first and second hinge units 31 and 32.

Each of the third pin units PIN3 has a substantially cylindrical shape elongated in the second direction D2. Each of the third pin units PIN3 is inserted into the fifth and sixth holes H5 and H6 overlapped with each other to connect the first and second hinge units 31 and 32 to the first connection unit 33. Each of the first and second hinge units 31 and 32 rotates with respect to a corresponding third pin unit of the third pin units PIN3.

The second connection member 132 has the same structure as that of the first connection member 131 and is disposed to be symmetrical with the first connection member 131 in the second direction D2.

For instance, the second connection member 132 includes a third hinge unit 34, a fourth hinge unit 35, a second connection unit 36, and two fourth pin units PIN4, which have the same shapes as those of the first hinge unit 31, the second hinge unit 32, the first connection unit 33, and the two third pin units PIN3, respectively, and are disposed to be symmetrical with respect to the first hinge unit 31, the second hinge unit 32, the first connection unit 33, and the two third pin units PIN3. The other side of the third hinge unit 34 in the third direction D3 is connected to the other side of the third extension part EX3 in the first direction D1 and the other side surface of the third extension part EX3 in the second direction D2. The other side surface of the fourth hinge unit 35 in the third direction D3 is connected to the sixth extension part EX6 in the first direction D1 and the other side surface of the sixth extension part EX6 in the second direction D2.

Each of the fourth pin units PIN4 is inserted into seventh and eighth holes H7 and H8 overlapped with each other to connect the third and fourth hinge units 34 and 35 to the second connection unit 36. Each of the third and fourth hinge units 34 and 35 rotates with respect to a corresponding fourth pin unit PIN4 of the fourth pin units PIN4. Thus, each of the first and third hinge units 31 and 34 is rotated with respect to a corresponding pin unit of the third and fourth pin units PIN3 and PIN4. In addition, each of the second and fourth hinge units 32 and 35 is rotated with respect to a corresponding pin unit of the third and fourth pin units PIN3 and PIN4.

Figure 3:
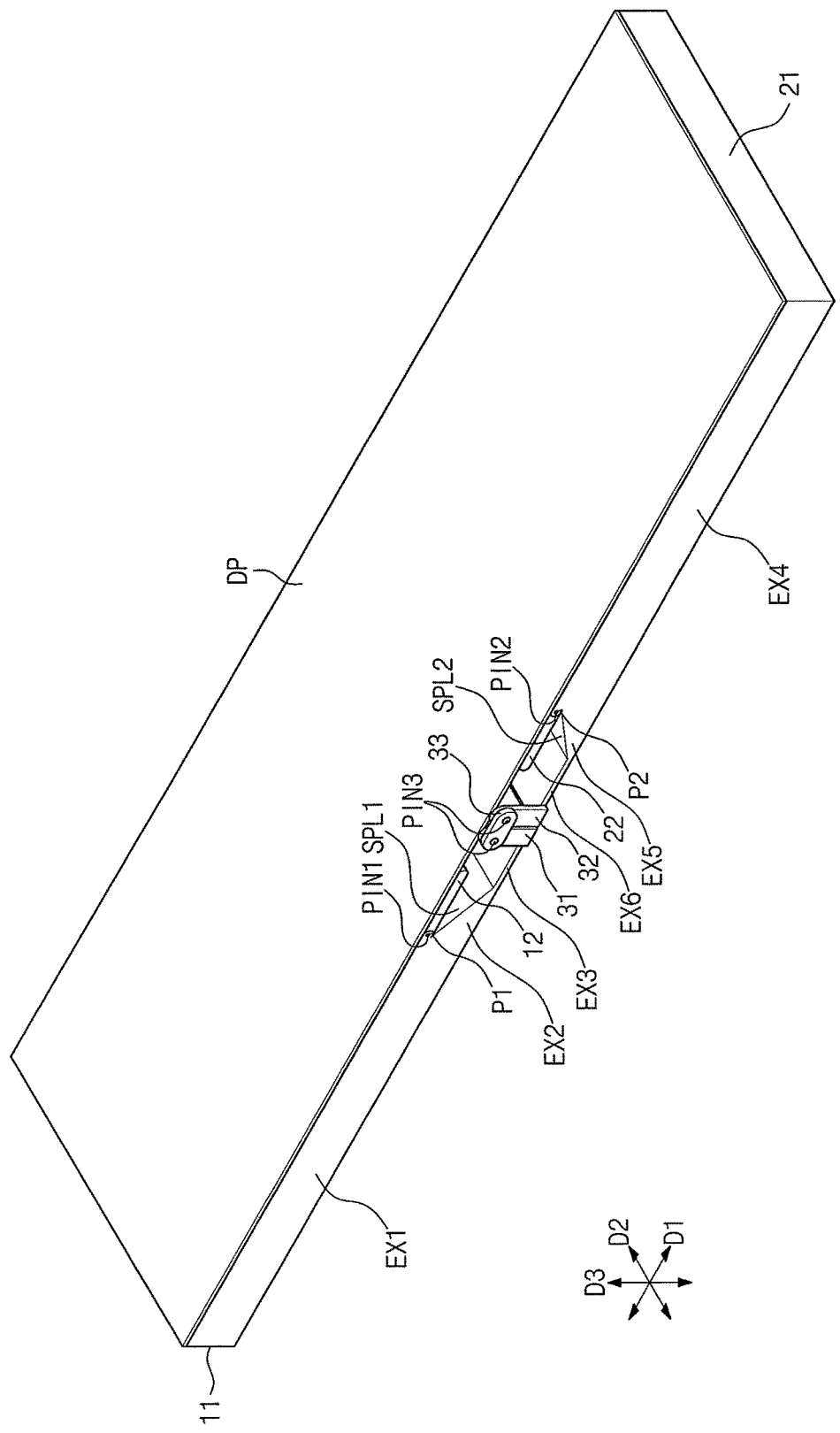
FIG. 3 illustrates a perspective view of an unfolding state of the display device according to the first exemplary embodiment of the present disclosure.
Figure 4:
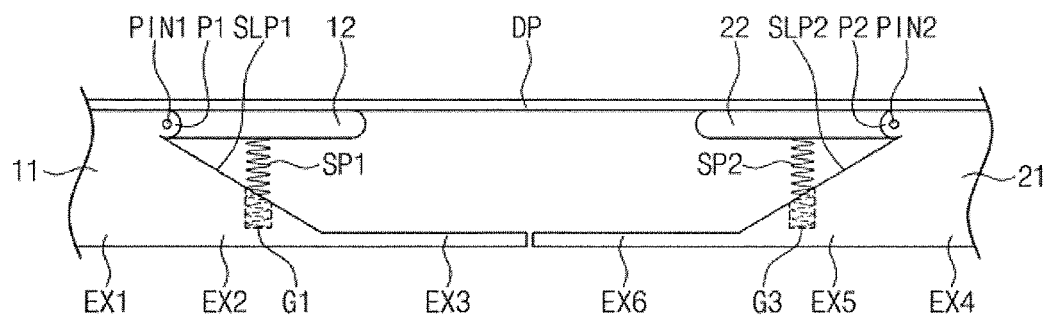
FIG. 4 illustrates a view of a predetermined area of a side surface of the display device shown in FIG. 3.

FIG. 2 illustrates a perspective view of a folding state of the display device 100, FIG. 3 is a perspective view of an unfolding state of the display device 100, and FIG. 4 is an enlarged side view of the display device shown in FIG. 3. It is noted that, for clarity and convenience of description, the first and second hinge units 31 and 32 are omitted from FIG. 4.

Referring to FIGS. 2, 3, and 4, the display device 100 according to the first exemplary embodiment includes a display panel DP and the folding device of FIG. 1, i.e., the first housing 110, the second housing 120, and the connection members 131 and 132. The display panel DP is placed on the folding device, and folded by the folding device.

In detail, as shown in FIG. 2, when the display panel DP is folded, the first and second housings 110 and 120 are disposed to be symmetrical with each other in the third direction D3. In addition, as shown in FIG. 3, when the display panel DP is unfolded, the first and second housings 110 and 120 are disposed to be symmetrical with each other in the first direction D1.

The display panel DP may be, but not limited to, a flexible display panel having flexibility. The display panel DP has the long sides in the first direction D1 and the short sides in the second direction D2 crossing the first direction D1. The display panel DP is disposed on the first and second housings 110 and 120 to overlap with the first and second housings 110 and 120.

As shown in FIG. 2, the first and second housings 110 and 120 are rotated using the connection members 131 and 132 to allow the first and second housings 110 and 120 to face each other, and thus the display panel DP is folded. As shown in FIGS. 3 and 4, the first and second housings 110 and 120 are rotated using the connection members 131 and 132 to allow the first and second housings 110 and 120 to be parallel to each other, and thus the display panel DP is unfolded.

In detail, the display panel DP is disposed on the first and second support frames 11 and 21. The first and second support frames 11 and 12 are rotated by the first and second connection members 131 and 132.

For instance, the first and third hinge units 31 and 34 are rotated with respect to the third and fourth pin units PIN3 and PIN4, respectively. In addition, the first and third hinge units 31 and 34 are disposed adjacent to the other side of the third extension part EX3 in the first direction D1 and connected to the both side surfaces of the third extension part EX3 in the second direction D2. Accordingly, the first support frame 11 is rotated with respect to the third and fourth pin units PIN3 and PIN4 respectively corresponding to the first and third hinge units 31 and 34.

The second and fourth hinge units 32 and 35 are rotated with respect to the third and fourth pin units PIN3 and PIN4, respectively. In addition, the second and fourth hinge units 32 and 35 are disposed adjacent to the other side of the sixth extension part EX6 in the first direction D1 and connected to the both side surfaces of the sixth extension part EX6 in the second direction D2. Therefore, the second support frame 21 is rotated with respect to the third and fourth pin units PIN3 and PIN4 respectively corresponding to the second and fourth hinge units 32 and 35.

As a result, as shown in FIG. 2, the first and second support frames 11 and 21 are rotated by the first and second connection members 131 and 132, so the upper surfaces of the first and second support frames 11 and 21 are disposed to face each other, thereby folding the display panel DP. In addition, as shown in FIGS. 3 and 4, the first and second support frames 11 and 21 are rotated by the first and second connection members 131 and 132, so the first and second support frames 11 and 21 are disposed to be substantially parallel to, i.e., level with, each other, thereby unfolding the display panel DP.

When the display panel DP is folded, a predetermined area of the center portion of the display panel DP disposed between the third and sixth extension parts EX3 and EX6 may have the arc shape by spaces defined between the second and fifth extension parts EX2 and EX5 and between the third and sixth extension parts EX3 and EX6. Hereinafter, the predetermined area of the center portion of the display panel DP disposed between the third and sixth extension parts EX3 and EX6 will be referred to as a first curvature portion CVT1.

In addition, when the display panel DP is folded, predetermined areas of the display panel DP, which respectively correspond to a predetermined area of the second extension part EX2 adjacent to a boundary between the first and second extension parts EX1 and EX2 and a predetermined area of the fifth extension part EX5 adjacent to a boundary between the fourth and fifth extension parts EX4 and EX5, may have the arc shape. Hereinafter, a predetermined area of the display panel DP, which respectively correspond to a predetermined area of the second extension part EX2 adjacent to a boundary between the first and second extension parts EX1 and EX2 and a predetermined area of the fifth extension part EX5 adjacent to a boundary between the fourth and fifth extension parts EX4 and EX5, will be referred to as a second curvature portion CVT2.

As the slant angle of the first slant surface SLP1 of the second extension part EX2, i.e., an angle between the first slant surface SLP1 and a bottom of the second extension part EX2, and the slant angle of the second slant surface SLP2 of the fifth extension part EX5, i.e., an angle between the second slant surface SLP2 and a bottom of the fifth extension part EX5, increases, the curvature of the second curvature portion CVT2 becomes larger. That is, since the first and second slant surfaces SLP1 and SLP2 are more bent with respect to the first direction D1, as the slant angle of each of the first and second slant surfaces SLP1 and SLP2 becomes greater, the second curvature portion CVT2 is more bent, e.g., the second curvature portion CVT2 has an increased deviation relative to a straight line.

On the contrary, as the slant angle of the first slant surface SLP1 of the second extension part EX2 and the slant angle of the second slant surface SLP2 of the fifth extension part EX5 become smaller, the curvature of the second curvature portion CVT2 becomes smaller. That is, when the first and second slant surfaces SLP1 and SLP2 are only slightly bent with respect to the first direction D1, as the slant angle of each of the first and second slant surfaces SLP1 and SLP2 becomes smaller, the second curvature portion CVT2 is less bent, e.g., the second curvature portion CVT2 has a smaller deviation relative to a straight line.

In the present exemplary embodiment, the slant angle of the first slant surface SLP1 of the second extension part EX2 and the slant angle of the second slant surface SLP2 of the fifth extension part EX5 are set to allow the curvature of the first curvature portion CVT1 to be smaller than the curvature of the second curvature portion CVT2.

The display panel DP is flexible, and has a predetermined restoring force. The restoring force of the display panel DP is greater than the elastic force of the first and second elastic members SP1 and SP2. Accordingly, the first and second moving bars 12 and 22 move, e.g., are pushed, to make contact with the first and second slant surfaces SLP1 and SLP2 by the restoring force of the display panel DP when the display panel DP is folded as shown in FIG. 2.

Since the restoring force of the display panel DP is greater than the elastic force of the first and second elastic members SP1 and SP2, the first and second elastic members SP1 and SP2 are pushed into the first and third grooves G1 and G3 by the first and second moving bars 12 and 22, which move along the restoring force of the display panel DP. As a result, the first and second elastic members SP1 and SP2 are contracted and inserted into the first and third grooves G1 and G3, and thus the first and second elastic members SP1 and SP2 are not seen when the display panel DP is folded.

As shown in FIGS. 3 and 4, the display panel DP may be unfolded until the side surface of the first hinge unit 31 makes contact with the side surface of the second hinge unit 32 in the first direction D1. In addition, although not shown in the figures, the display panel DP may be unfolded until the side surface of the third hinge unit 34 makes contact with the side surface of the fourth hinge unit 35 in the first direction D1. That is, the display panel DP may be unfolded at about 180 degrees.

When the display panel DP is unfolded, the first and second moving bars 12 and 22 move upwardly by the first and second elastic members SP1 and SP2 having the predetermined elastic force.

The length in the third direction D3 of the first and second elastic members SP1 and SP2 is set such that the first and second moving bars 12 and 22 move to a height substantially parallel to the upper surface of each of the first and fourth extension parts EX1 and EX4. Therefore, when the display panel DP is unfolded, the first and second moving bars 12 and 22 that move upwardly by the elastic force of the first and second elastic members SP1 and SP2 may be disposed to be substantially parallel to the upper surfaces of the first and fourth extension parts EX1 and EX4 (FIG. 4).

When the display panel DP is unfolded, the first and second moving bars 12 and 22 disposed to be parallel to the upper surfaces of the first and second extension parts EX1 and EX4 support the predetermined area of the display panel DP disposed between the first and fourth extension parts EX1 and EX4 and adjacent to the first and fourth extension parts EX1 and EX4. As a result, the display panel DP may be prevented from sagging between the first and fourth extension parts EX1 and EX4.

Figure 5:
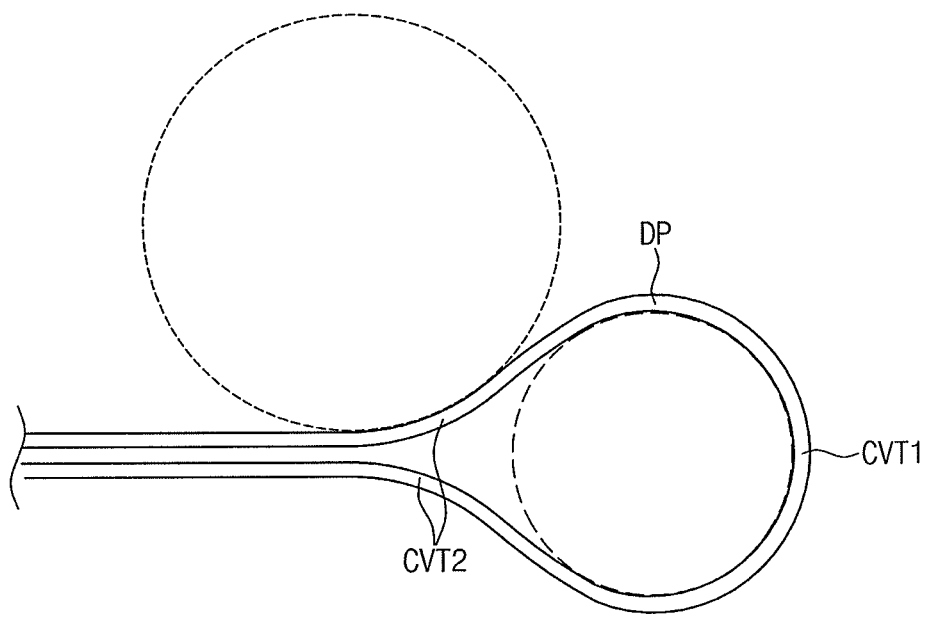
FIG. 5 illustrates a view of a folding state of a display panel shown in FIG. 2.
Figure 6:
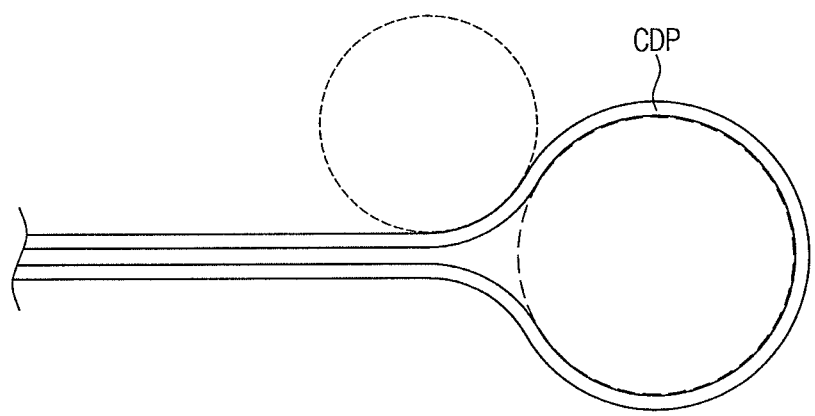
FIG. 6 illustrates a view of a comparison display panel folded to allow a curvature of a second curvature portion to be greater than a curvature of a first curvature portion.

FIG. 5 illustrates an enlarged, schematic view of the folding state of the display panel DP shown in FIG. 2, and FIG. 6 illustrates an enlarged, schematic view of a comparison display panel folded to allow the curvature of the second curvature portion to be greater than the curvature of the first curvature portion. In FIGS. 5 and 6, for convenience of explanation, circles respectively corresponding to the curvature of the first curvature portion CVT1 and the curvature of the second curvature portion CVT2 are represented by a dotted line.

Referring to FIG. 5, the display device 100 according to the present exemplary embodiment folds the display panel DP, such that the curvature of the first curvature portion CVT1 is greater than the curvature of the second curvature portion CVT2. In contrast, a comparison display device, e.g., a display device with a display panel CDP without the second and fifth extension parts EX2 and EX5, may have a curvature of a second curvature portion greater than that of a first curvature portion (FIG. 6). As such, durability of the display device with the comparison display panel CDP corresponds to the curvature of the first curvature portion CVT1, and elements of the comparison display panel CDP, which are disposed on the second curvature portion, may be damaged.

However, in the present exemplary embodiment, since the curvature of the second curvature portion CVT2 is larger than the curvature of the first curvature portion CVT1, the elements of the display panel DP, which are disposed on the second curvature portion CVT2, may not be damaged when the display panel DP is folded. Consequently, the display device 100 according to the first exemplary embodiment may prevent the display panel DP from being damaged when the display panel DP is folded.

Figure 7:
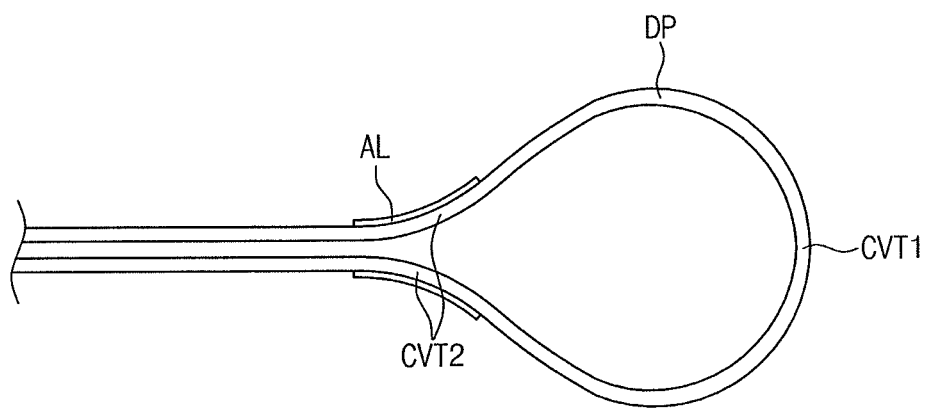
FIGS. 7 and 8 illustrate views of a folding state of a display panel of a display device according to a second exemplary embodiment of the present disclosure.
Figure 8:
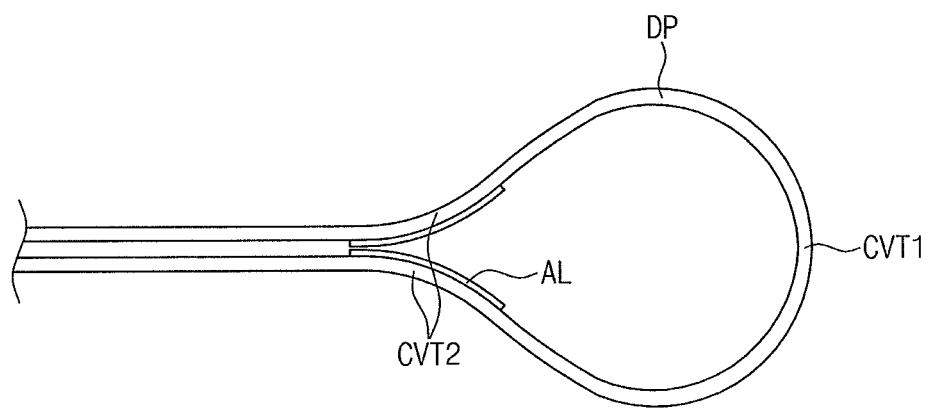
Figure 9:
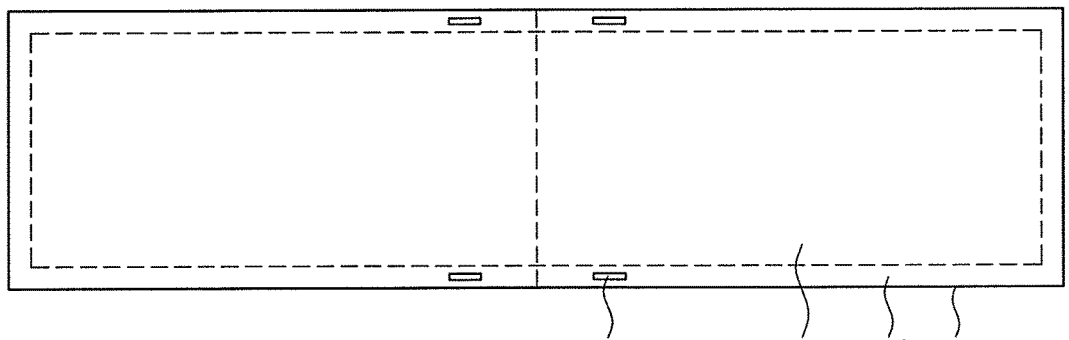
FIG. 9 illustrates a view of an unfolding state of the display panel of the display device according to the second exemplary embodiment of the present disclosure.
Figure 9:
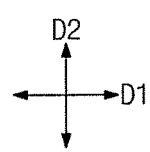

FIGS. 7 and 8 illustrate views of a folding state of a display panel DP of a display device according to a second exemplary embodiment of the present disclosure, and FIG. 9 is a view showing an unfolding state of the display panel DP in the second exemplary embodiment of the present disclosure.

Referring to FIGS. 7, 8, and 9, the display panel DP includes a display area DA and a non-display area NDA disposed adjacent to the display area DA. In the non-display area NDA of the display panel DP, a plurality of additional layers AL is disposed on an upper or lower portion of the second curvature portion CVT2. The display device according to the second exemplary embodiment has the same structure and function as those of the display device 100 according to the first exemplary embodiment, except that the additional layers AL are disposed on the display panel DP.

The additional layers AL may be flexible layers having flexibility. For instance, the additional layers AL may include polyimide (PI) or polycarbonate (PC).

In general, a restoring force of the flexible display panel is proportional to a thickness of the flexible display panel. That is, when the flexible display panel is folded, the flexible display panel is less bent as the thickness of the flexible display panel becomes thicker. Since the second restoring force of the second curvature portion CVT2 is enhanced by the additional layers AL, the curvature of the second curvature portion CVT2 is reduced.

As described above, since the additional layers AL are disposed on the second curvature portion CVT2, the curvature of the second curvature portion CVT2 is reduced. Thus, when the display panel DP is folded, the elements disposed on the second curvature portion CVT2 of the display panel DP may be prevented from being damaged. Consequently, the display device according to the second exemplary embodiment may prevent the display panel DP from being damaged when the display panel DP is folded.

Figure 10:
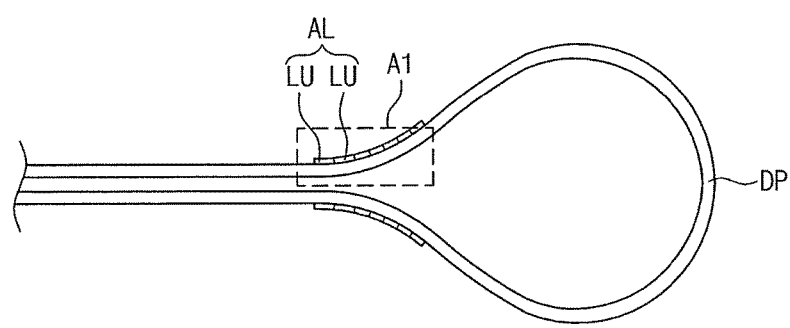
FIG. 10 illustrates a view of a folding state of a display panel of a display device according to a third exemplary embodiment of the present disclosure.
Figure 11:
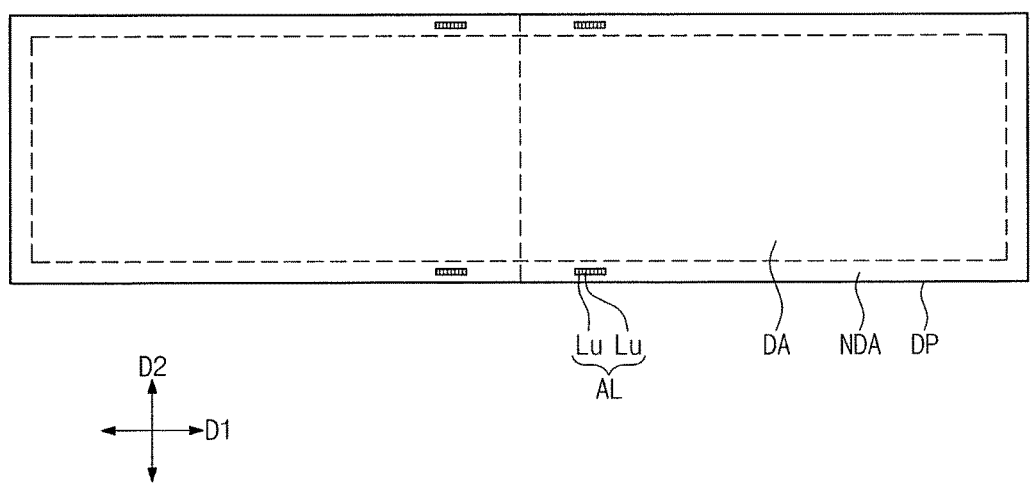
FIG. 11 illustrates a view of an unfolding state of the display panel of the display device according to a third exemplary embodiment of the present disclosure.
Figure 12:
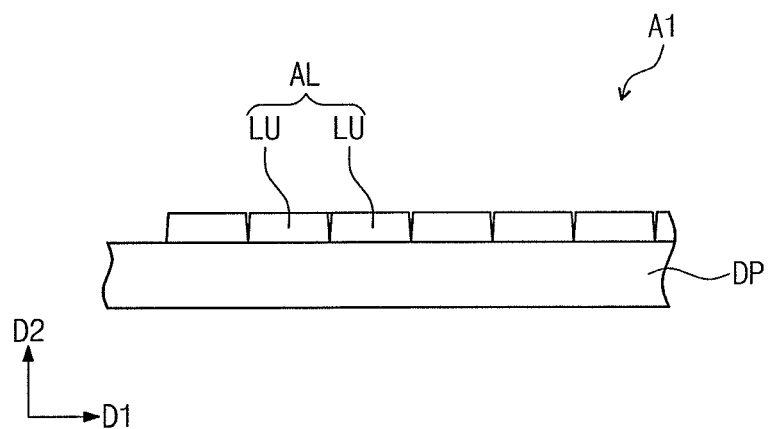
FIGS. 12 and 13 illustrate enlarged views of a first area shown in FIG. 10.
Figure 13:
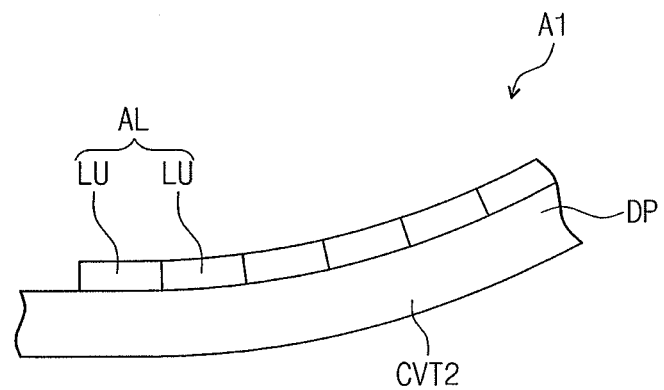

FIG. 10 illustrates a view of a folding state of a display panel of a display device according to a third exemplary embodiment of the present disclosure, and FIG. 11 is a view of an unfolding state of the display panel of the display device according to the third exemplary embodiment of the present disclosure. FIGS. 12 and 13 are enlarged views showing a first area shown in FIG. 10.

Referring to FIGS. 10 to 13, in the display area DA and the non-display area NDA of the display panel DP, a plurality of additional layers AL is disposed on the second curvature portion CVT2. The additional layers AL is disposed on the lower portion of the second curvature portion CVT2 when the display panel DP is in the unfolding state.

Each of the additional layers AL includes a plurality of layer units LU arranged in the first direction D1. The layer units LU may be, but not limited to, a rigid type layer. The display device according to the third exemplary embodiment has the same structure and function as those of the display device according to the first exemplary embodiment, except for the layer units LU disposed on the display panel DP.

As shown in FIG. 12, a side surface of each of the layer units LU has a trapezoid shape when viewed in the second direction D2, i.e., a cross-section of each layer unit LU is trapezoidal when viewed in a plane defined by the first and second directions D1 and D2. That is, upper and lower edges of each of the layer units LU are substantially parallel to each other in the side surface of the layer units LU when viewed in the second direction D2. In each of the layer units LU, a length of the lower edge is longer than a length of the upper edge, and a left edge has the same slant angle of a right edge. In this case, when the display panel DP is folded, side surfaces of the layer units LU, which correspond to the left and right edges of the layer units LU, make contact with each other in the first direction D1 (FIG. 13).

The second curvature portion CVT2 is bent until the side surfaces of the layer units LU make contact with each other. That is, when the side surfaces of the layer units LU do not make contact with each other, the second curvature portion CVT2 is not bent. The slant angle of the left and right edges of each of the layer units LU may be set to allow the curvature of the second curvature portion CVT2 to be larger than the curvature of the first curvature portion CVT1 when the side surfaces of the layer units LU make contact with each other. Since the layer units LU are additionally disposed on the second curvature portion CVT2, the curvature of the second curvature portion CVT2 is increased. Accordingly, when the display panel DP is folded, the elements disposed on the second curvature portion CVT2 may be prevented from being damaged. Consequently, the display device according to the third exemplary embodiment may prevent the display panel DP from being damaged when the display panel DP is folded.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a first support frame including a first slant surface having a predetermined slant angle;
   a second support frame including a second slant surface having a same structure as the first slant surface and being disposed symmetrically with respect to the first slant surface;
   a display panel disposed on the first and second support frames;
   a connection member connecting the first and second support frames, the first and second support frames being rotatable around a rotational axis defined by the connection member;
   a first moving bar disposed under the display panel and on the first slant surface, the first moving bar being rotatable with respect to a rotational axis adjacent to first side of the first slant surface;
   a second moving bar having a same structure as the first moving bar, and disposed under the display panel and on the second slant surface, the second moving bar being rotatable with respect to a rotational axis adjacent to the first side of the second slant surface; and
   a plurality of elastic members disposed in a plurality of grooves defined in the first and second slant surfaces,
   wherein the first and second slant surfaces are disposed in predetermined areas of upper surfaces of the first and second support frames, respectively,
   wherein the elastic members support the first and second moving bars, and
   wherein first areas of the first and second support frames have a larger thickness than second areas of the first and second support frames, respectively, the first areas being adjacent to respective first sides of the first and second slant surfaces, and the second areas being adjacent to respective second sides of the first and second slant surfaces and being connected to the connection member, the first areas of the first and second support frames being parallel to the second areas of the first and second support frames.

2. The display device as claimed in claim 1, wherein the first and second support frames include a long side in a first direction and a short side in a second direction crossing the first direction, and the first and second moving bars include a short side in the first direction and a long side in the second direction.

3. The display device as claimed in claim 2, wherein the first support frame further comprises:
   a first extension part having a first thickness;
   a second extension part having the first slant surface;
   a third extension part having a second thickness smaller than the first thickness; and
   two first protrusions protruding from a side surface of the first extension part adjacent to the second extension part, the two first protrusions being adjacent to an upper surface of the first extension part in a third direction crossing the first and second directions, and respectively disposed at opposite sides of the first extension part in the second direction,
   wherein lower surfaces of the first, second, and third extension parts are substantially level with each other, a first side of the second extension part in the first direction is connected to the first extension part, a second side of the second extension part is connected to a first side of the third extension part, a second side of the third extension part is connected to the connection member, and the first slant surface corresponds to an upper surface of the second extension part and is bent downwardly toward the third extension part at the predetermined slant angle with respect to the first direction.

4. The display device as claimed in claim 3, wherein the first side of the first slant surface in the first direction is connected to a lower portion of the side surface of the first extension part between the first protrusions, and the second side of the first slant surface in the first direction is connected to a boundary of an upper surface of the third extension part adjacent to the second extension part.

5. The display device as claimed in claim 3, wherein:
   the second support frame further comprises fourth, fifth, and sixth extension parts and second protrusions respectively having the same structure as the first, second, and third extension parts and the first protrusions, and disposed to be symmetrical with the first, second, and third extension parts and the first protrusions,
   the fifth extension part includes the second slant surface, a first side of the fifth extension part in the first direction being connected to the fourth extension part, and a second side of the fifth extension part in the first direction being connected to a first side of the sixth extension part, and
   a second side of the sixth extension part is connected to the connection member.

6. The display device as claimed in claim 1, wherein, when the display panel is folded, a curvature of a first curvature portion defined by a predetermined area of a center portion of the display panel disposed between the second areas of the first and second support frames is greater than a curvature of a second curvature portion defined by a predetermined area of the display panel, which corresponds to each of a predetermined area of the slant surface adjacent to a boundary between the slant surface and a corresponding first area.

7. The display device as claimed in claim 6, wherein a slant angle of each of the first and second slant surfaces is set to allow the curvature of the first curvature portion to be greater than the curvature of the second curvature portion.

8. The display device as claimed in claim 6, further comprising a plurality of additional layers on or under the second curvature portion to increase a restoring force of the second curvature portion and having a flexibility, wherein the additional layers are disposed in a non-display area neighboring a display area of the display panel.

9. The display device as claimed in claim 6, further comprising a plurality of additional layers disposed under the second curvature portion to increase a restoring force of the second curvature portion and a non-display area neighboring a display area of the display panel, wherein each of the additional layers comprises a plurality of layer units arranged in a first direction and being a rigid type, a side surface of each of the layer units has a trapezoid shape when viewed in a second direction, a lower edge of the layer units is longer than an upper edge of the layer units, and left and right edges of each of the layer units has a same slant angle.

10. The display device as claimed in claim 5, wherein the elastic members include:
a plurality of first elastic members having a predetermined elastic force; and
a plurality of second elastic members having a same structure as the first elastic members and being symmetrical with the first elastic members,
wherein the grooves include:
a plurality of first grooves arranged in the second direction and recessed downwardly from the upper surface of the second extension part, and
a plurality of additional grooves having a same structure as the first grooves and being symmetrical with the first grooves, and
wherein each of the first elastic members is in a corresponding first groove of the first grooves, each of the second elastic members is disposed in a corresponding additional groove of the additional grooves, and a length in the third direction of the first and second elastic members is longer than a depth of the first and additional grooves.

11. The display device as claimed in claim 10, wherein each of the first protrusions includes a first hole through a corresponding first protrusion of the first protrusions along the second direction.

12. The display device as claimed in claim 11, wherein the first moving bar includes:
two second grooves adjacent to a first side of the first moving bar in the first direction and recessed from both side surfaces of the first moving bar in the second direction to a center portion of the first moving bar; and
a second hole through the first moving bar between the second grooves along the second direction, a portion of the first moving bar between the second grooves being between the first protrusions, and the first holes overlapping with the second hole.

13. The display device as claimed in claim 12, further comprising a first pin unit with a cylindrical shape elongated in the second direction, the first pin unit being inserted into the first holes and the second hole.

14. The display device as claimed in claim 13, further comprising a second pin unit having a same structure as the first pin unit, wherein:
each of the second protrusions includes a third hole having a same structure as the first hole and disposed to be symmetrical with the first hole,
the second moving bar includes fourth grooves and a fourth hole, which respectively have a same structure as the second grooves and the second hole and are disposed symmetrical with the second grooves and the second hole,
a portion of the second moving bar between the fourth grooves is disposed between the second protrusions, the third holes overlapping with the fourth hole, and
the second pin unit is inserted into the third holes and the fourth hole.

15. The display device as claimed in claim 14, wherein the first moving bar is rotatable with respect to the first pin unit, and the second moving bar is rotatable with respect to the second pin unit.

16. The display device as claimed in claim 14, wherein the connection member includes a first connection member and a second connection member, which are respectively disposed adjacent to the second sides of the third and sixth extension parts in the first direction, and are respectively connected to both side surfaces of each of the third and sixth extension parts in the second direction.

17. The display device as claimed in claim 16, wherein:
the first connection member includes:
first and second hinge units extending in and arranged in the third direction;
a first connection unit connecting a first side of the first hinge unit to a first side of the second hinge unit, which face each other in the third direction; and
third pin units extending in the second direction to connect the first side of the first hinge unit and the first side of the second hinge unit to both sides of the first connection unit, respectively,
the second connection member includes:
third and fourth hinge units, a second connection unit, and fourth pin units, which have the same structures as the first and second hinge units, the first connection unit, and the third pin units and are disposed to be symmetrical with the first and second hinge units, the first connection unit, and the third pin units,
second sides of the first and third hinge units in the third direction are respectively connected to a second side of the third extension part in the first direction and to both side surfaces of the third extension part in the second direction, and
second sides of the second and fourth hinge units in the third direction are respectively connected to a second side of the sixth extension part in the first direction and to both side surfaces of the sixth extension part in the second direction.

18. The display device as claimed in claim 17, wherein each of the first and third hinge units is rotatable with respect to a corresponding pin unit of the third and fourth pin units and each of the second and fourth hinge units is rotatable with respect to a corresponding pin unit of the third and fourth pin units.

19. The display device as claimed in claim 10, wherein the display panel has a restoring force greater than an elastic force of the first and second elastic members, the first and second moving bars being movable to contact the first and second slant surfaces by the restoring force of the display panel when the display panel is folded, the first and second moving bars being movable upwardly by the first and second elastic members when the display panel is unfolded, and a length in the third direction of the first and second elastic members being set to allow the first and second moving bars to move to a height substantially parallel to the upper surface of the first and fourth extension parts.

\* \* \* \* \*